(12) United States Patent
Abe et al.

(10) Patent No.: US 7,071,768 B2
(45) Date of Patent: Jul. 4, 2006

(54) SEMICONDUCTOR INTEGRATED CIRCUIT HAVING CONTROLLABLE INTERNAL SUPPLY VOLTAGE

(75) Inventors: Hiroyuki Abe, Kawasaki (JP); Yutaka Takasuka, Kawasaki (JP); Hisao Ise, Kawasaki (JP); Hiroko Takano, Kawasaki (JP); Sachie Takahashi, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/628,580

(22) Filed: Jul. 29, 2003

(65) Prior Publication Data
US 2004/0057324 A1   Mar. 25, 2004

(30) Foreign Application Priority Data
Aug. 8, 2002   (JP)   ............................. 2002-231451

(51) Int. Cl.
 *G05F 1/10*   (2006.01)
 *G05F 3/02*   (2006.01)
(52) U.S. Cl. ..................................... 327/540
(58) Field of Classification Search ................ 327/538, 327/540, 541, 543; 713/322
See application file for complete search history.

(56) References Cited

U.S. PATENT DOCUMENTS

| 5,021,679 | A | | 6/1991 | Fairbanks et al. | ............. 307/66 |
| 5,153,535 | A | | 10/1992 | Fairbanks et al. | ........... 331/143 |
| 5,307,003 | A | | 4/1994 | Fairbanks et al. | ........... 323/222 |
| 5,760,636 | A | * | 6/1998 | Noble et al. | ................. 327/513 |
| 6,425,086 | B1 | * | 7/2002 | Clark et al. | ................. 713/322 |
| 6,545,627 | B1 | * | 4/2003 | He et al. | ...................... 341/155 |
| 6,664,775 | B1 | * | 12/2003 | Clark et al. | ................. 323/351 |
| 2003/0206050 | A1 | * | 11/2003 | Huard et al. | ................. 327/540 |

FOREIGN PATENT DOCUMENTS

JP   2001-156261   6/2001

* cited by examiner

*Primary Examiner*—Quan Tra
(74) *Attorney, Agent, or Firm*—Arent Fox PLLC

(57) ABSTRACT

In an integrated circuit having an internal supply voltage generation circuit which generates an internal supply voltage by descending an external supply voltage, there is provided an internal circuit which operates with a supplied internal supply voltage. The internal supply voltage generation circuit changes an internal supply voltage level to be generated in accordance with an operation speed of the internal circuit. Preferably the semiconductor integrated circuit includes a clock control circuit which generates an internal clock signal the frequency of which is controlled in accordance with the operation speed of the internal circuit. When the internal clock signal is controlled to have a higher frequency, the internal supply voltage is controlled to be higher. Also, when the internal clock signal is controlled to have a lower frequency, the internal supply voltage is controlled to be lower.

23 Claims, 4 Drawing Sheets

SEMICONDUCTOR INTEGRATED CIRCUIT HAVING CONTROLLABLE INTERNAL SUPPLY VOLTAGE

CROSS-REFERENCE TO RELATED APPLICATIONS

This application is based upon and claims the benefit of priority from the prior Japanese Patent Application No. 2002-231451, filed on Aug. 8, 2002, the entire contents of which are incorporated herein by reference.

FIELD OF THE INVENTION

The present invention relates to a semiconductor integrated circuit such as a microcontroller for control use and more particularly a semiconductor integrated circuit of which internal supply voltage is controllable according to an operation mode, thereby saving power consumption.

BACKGROUND OF THE INVENTION

In recent years, a semiconductor integrated circuit, particularly a microcontroller for control use, is required to have high-speed processing capability, and at the same time, with low power consumption. In order to meet a requirement for processing at higher speed, such an integrated circuit becomes more minutely fabricated. As each transistor size becomes smaller, an operation voltage tends to become lower. This requires a semiconductor integrated circuit to be provided with an internal power supply which supplies a lower voltage in comparison with a power supply voltage prepared by an external circuit. For this purpose, in such a semiconductor integrated circuit, there is embedded a direct current (DC) voltage regulator which generates an internal supply voltage stepped down from an external supply voltage. Controlling the semiconductor integrated circuit to operate with a decreased internal supply voltage enables to reduce power consumption.

Further, in order to obtain lower power consumption, a variety of power saving modes may often be provided in a semiconductor integrated circuit such as a microcontroller. As one example, a semiconductor integrated circuit is so configured as to shift to a standby mode when a state of no operational instruction continues for a predetermined period. Clock signal supply is suspended during such a standby mode, which generally suspends a part of operation in an internal circuit of the integrated circuit.

In the conventional semiconductor integrated circuit, internal supply voltage is so controlled as to keep constant. For example, the internal supply voltage is controlled to maintain in a constant voltage irrespective of a high-speed operation mode or a low-speed operation mode. In the high-speed operation mode, an operation clock signal is set to have a higher frequency, which produces larger power consumption in the internal circuit, while in the low-speed operation mode, the operation clock signal frequency is set lower, which produces smaller power consumption in the internal circuit. Thus, when controlling the internal circuit to operate at lower speed by decreasing the supplied clock signal frequency, a substantial power saving mode can be attained. In such a manner, actual power saving is achieved as a whole.

However, there has been arising requirement for further power saving in recent years. In particular, for example, in case of a portable device the control unit of which is driven by batteries, further reduction of power consumption is strongly desired.

SUMMARY OF THE INVENTION

Accordingly, it is an object of the present invention to provide a semiconductor integrated circuit which enables to save power consumption.

In one aspect of the present invention to attain the aforementioned object, in an integrated circuit having an internal supply voltage generation circuit which generates an internal supply voltage by descending an external supply voltage, there is provided an internal circuit which operates with a supplied internal supply voltage. The internal supply voltage generation circuit changes an internal supply voltage level to be generated in accordance with an operation speed of the internal circuit.

In one embodiment according to the aforementioned aspect of the present invention, preferably the semiconductor integrated circuit includes a clock control circuit which generates an internal clock signal the frequency of which is controlled in accordance with the operation speed of the internal circuit. When the internal clock signal is controlled to have a higher frequency, the internal supply voltage is controlled to be higher. Also, when the internal clock signal is controlled to have a lower frequency, the internal supply voltage is controlled to be lower. With such a control method, it is possible to circumvent occurrence of inoperable condition in the internal circuit, and at the same time, reduces power consumption largely while the internal circuit is operating at low speed.

In the preferred embodiment according to the aforementioned aspect of the present invention, in the clock control circuit generating the internal clock signal the frequency of which is controlled in accordance with the operation speed of the internal circuit, the clock control circuit controls not only the internal clock signal frequency, but also the internal supply voltage level generated by the internal supply voltage generation circuit. More specifically, when the internal clock signal is controlled to have a first frequency, the internal supply voltage is controlled to have a first voltage. Meanwhile, when the internal clock signal is controlled to have a second frequency which is lower than the first frequency, the internal supply voltage is controlled to have a second voltage which is lower than the first voltage. As such, when the internal clock signal is controlled to have a higher frequency, the internal supply voltage is controlled to be higher. Also, when the internal clock signal is controlled to have a lower frequency, the internal supply voltage is controlled to be lower. Here, the voltage level of the internal supply voltage is controlled to maintain higher than the minimum voltage level, over which the internal circuit is operational at each corresponding internal clock signal frequency.

According to the preferred embodiment in the aforementioned aspect of the present invention, when the internal circuit is controlled to set into the standby mode, or the sleep mode, the internal supply voltage generation circuit suspends generation of the internal supply voltage. Thus, during the standby mode, it is possible to prevent occurrence of leak current while the internal circuit stays in a non-operation state, enabling reduction of power consumption.

Further, according to the preferred embodiment in the aspect of the present invention, in accordance with a program executed by a CPU included in the internal circuit, the internal clock signal frequency generated by the clock control circuit is controlled, and further the internal supply voltage level generated by the internal supply voltage generation circuit is controlled. Typically, the execution program judges whether the internal circuit is running in a high-speed operation mode or a low-speed operation mode. When it is judged the internal circuit is running in the high-speed operation mode, the internal clock signal frequency is controlled to be higher, and also the internal supply voltage is controlled to be higher. Meanwhile, when the internal circuit is determined to be running in the low-speed operation mode, the internal clock signal frequency is controlled to be lower, and also the inter supply voltage is controlled to be lower.

Further scopes and features of the present invention will become more apparent by the following description of the embodiments with the accompanied drawings.

DETAILED DESCRIPTION OF THE PREFERRED EMBODIMENTS

The preferred embodiment of the present invention is described hereinafter referring to the charts and drawings. However, it is to be noted that the scope of the present invention must not be limited to the embodiments described below. The scope of the present invention runs to the inventions described in the claims and the equivalents thereof.

Figure 1:
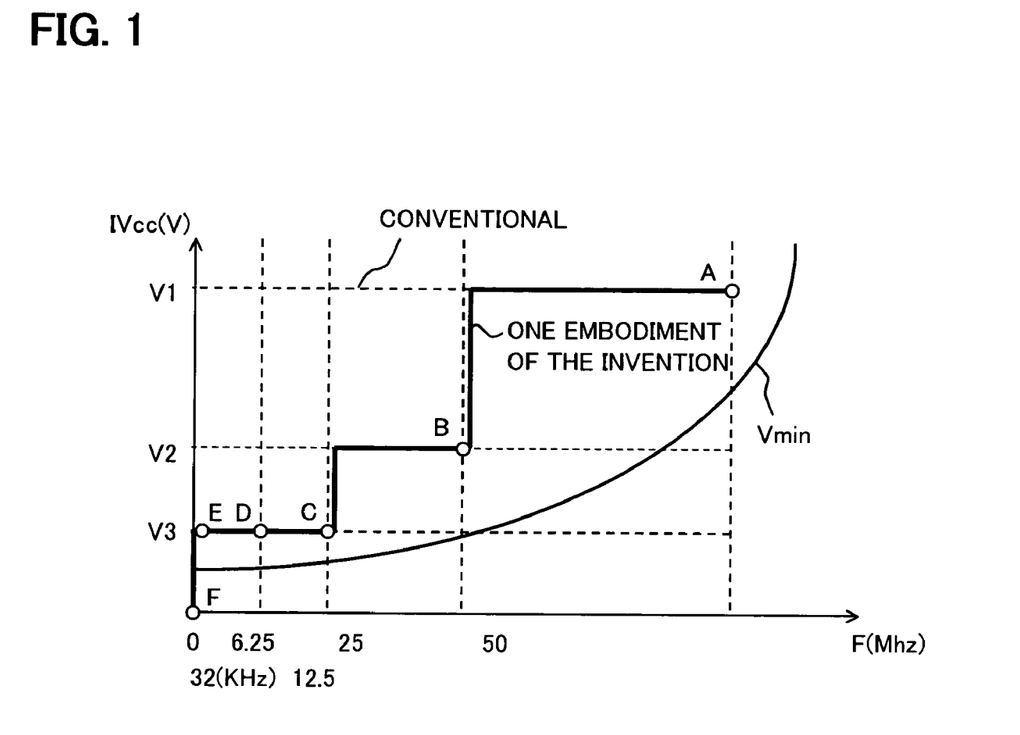
FIG. 1 shows a diagram illustrating relationship of the operation frequency with the operation voltage according to an embodiment of the present invention.

FIG. 1 shows a diagram illustrating relationship of the operation frequency with the operation voltage according to an embodiment of the present invention. The horizontal axis indicates the internal clock signal frequency F which is supplied to an internal circuit in a semiconductor integrated circuit. The vertical axis indicates the internal supply voltage IVcc. The inventors of the present invention have found out that such an internal circuit can sufficiently operate even when the internal supply voltage is set lower to some extent in the case of a low-speed operation mode to which a low clock signal frequency is applied. However, the internal circuit cannot be operational unless the internal supply voltage is set higher to some extent in the case of a high-speed operation mode to which high clock signal frequency is applied. More specifically, when defining the minimum internal supply voltage Vmin over which the internal circuit is operational at a given clock signal frequency, the above-defined minimum operational voltage Vmin becomes higher as the clock signal frequency becomes higher, as shown in FIG. 1. Also, the minimum operational voltage Vmin becomes lower as the clock signal frequency becomes lower. In short, when the operation frequency is set lower, the internal circuit is operational even with a relatively low supply voltage, on condition that the internal supply voltage is set higher than the minimum operational voltage Vmin of the internal supply voltage.

A voltage V1 is a level of internal supply voltage which is generated by, for example, a conventional internal supply voltage generation circuit. As shown by the broken lines in FIG. 1, this internal supply voltage V1 is higher than the minimum operational voltage Vmin of the internal supply voltage corresponding to the maximum clock signal frequency. Conventionally, the internal supply voltage is controlled to maintain uniformly at voltage V1 whether clock signal frequency F is high or low. In contrast, according to the embodiment of the present invention, when clock signal frequency F is relatively high, the internal supply voltage is controlled so as to set to voltage V1 higher than the minimum operational voltage Vmin of the internal supply voltage at a given clock signal frequency F. Also, as clock signal frequency F becomes lower, the internal supply voltage is controlled to shift to voltage V2 or V3, which is lower than voltage V1 and higher than the minimum operational voltage Vmin of the internal supply voltage at each clock signal frequency.

Further, according to the embodiment of the present invention, when the internal circuit stays in the standby mode, the internal clock signal is suspended, which means the clock signal frequency is zero. At this time, the internal supply voltage generated by the internal supply voltage generation circuit is suspended. As a result, the internal supply voltage is also controlled to become zero. Namely, as shown by the bold lines in FIG. 1, as the operation frequency is becoming lower, the levels of the internal supply voltage IVcc are controlled to be on the points A, B, C, D, E and F. Here, each of these controlled voltage levels is higher than the minimum operational voltage Vmin over which the internal circuit is operational at each frequency.

Figure 2:
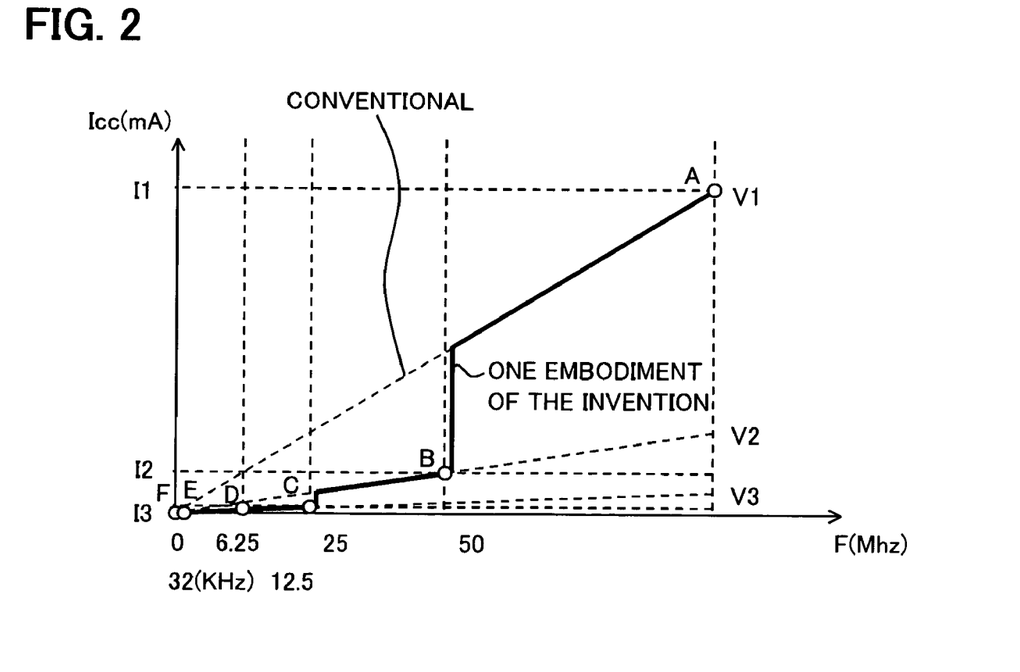
FIG. 2 shows a diagram illustrating relationship of the operation frequency with the consumption current, based on the control of the internal supply voltage shown in FIG. 1.

FIG. 2 shows a diagram illustrating relationship of the operation frequency with the consumption current in accordance with the control of internal supply voltage shown in FIG. 1. The horizontal axis indicates the clock signal frequency, and the vertical axis indicates the consumption current. In FIG. 2, the consumption currents are shown corresponding to the cases of the controlled internal supply voltages V1, V2 and V3. For example, when the controlled internal supply voltage is V1, the consumption current decreases in proportion to the decrease of frequency F. Conventionally, the consumption current was decreased in proportion to the decrease of frequency F as shown by the characteristic line (broken line) in the case of voltage V1, because the internal supply voltage was conventionally fixed as V1.

In contrast, in the embodiment of the present invention, as internal clock signal frequency F decreases, the internal supply voltage is controlled to decrease to V2 and V3. As a result, the consumption current in a lower clock signal frequency mode is controlled to become lower than that in the conventional example, as shown by the bold lines in FIG. 2. Namely, the consumption current is reduced as shown by the points A, B, C, D, E and F.

Further, in the standby mode, the controlled internal supply voltage. IVcc is set to zero. In the standby mode, the clock signal to be supplied to the internal circuit is suspended. Therefore, consumption current caused by the operation responding to the clock signal substantially disappears. However, according to the conventional method, a consumption current caused by a leak current arose in the internal circuit, as long as the internal supply voltage was being supplied. In contrast, according to the embodiment of the present invention, the internal supply voltage is also suspended simultaneously with the clock signal suspension, which enables to eliminate the above-mentioned leak current. Here, because the operation of the internal circuit is completely suspended in this embodiment, it becomes necessary to perform a reset operation when restoring from the standby mode similarly to the case of power-on. For this purpose, an external reset terminal is provided. In response to a reset signal externally input, an initialization operation is performed in the circuit in a similar manner to the reset operation performed when turning on power.

Figure 3:
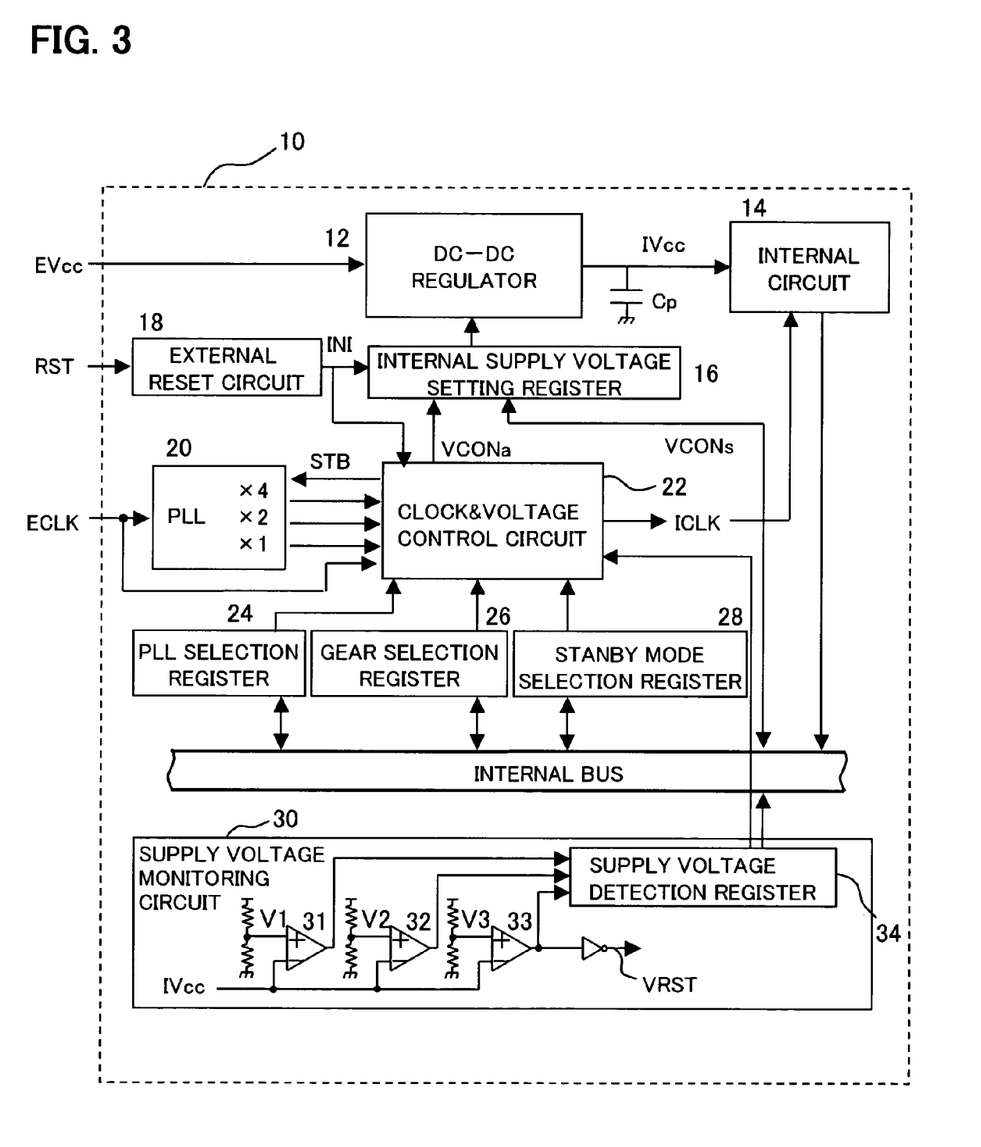
FIG. 3 shows a partial configuration diagram of a semiconductor integrated circuit according to the embodiment of the present invention.

FIG. 3 shows a partial configuration diagram of the semiconductor integrated circuit in the embodiment of the present invention. An integrated circuit 10 is configured with, for example, a one-chip controller which performs a variety of control operations. In this configuration, an internal circuit 14 includes a CPU which outputs predetermined control signals as a result of execution of program instructions externally input. There are supplied the internal supply voltage IVcc and an internal clock signal ICLK (hereafter simply referred to as 'internal clock ICLK') into the internal circuit 14. Also, in integrated circuit 10, there is embedded an internal supply voltage generation circuit 12 comprised of a DC—DC regulator (voltage control circuit), which generates the internal supply voltage IVcc from an external supply voltage EVcc supplied externally. A smoothing capacitor Cp, which is either embedded or externally attached, is connected to a wire from the internal supply voltage generation circuit.

Integrated circuit 10 further includes a phase locked loop (PLL) circuit 20 generating a clock signal which is frequency-divided from a clock signal ECLK supplied externally. Integrated circuit 10 also includes a clock control circuit 22 generating an internal clock signal the frequency of which is controlled in accordance with an operation speed of the internal circuit 14. More specifically, clock control circuit 22 generates the internal clock ICLK by selecting either one of the frequency-divided clock signals generated by PLL circuit 20, or an external clock signal. The above selection is determined by the use of the setting values set in a PLL selection register 24, a gear selection register 26 and a standby mode selection register 28. The CPU in the internal circuit 14 sets each of these setting values in accordance with each operation mode. Moreover, clock control circuit 22 suspends the clock signal supply during the standby mode. PLL selection register 24 provides a control data for use in selecting either the external clock signal ECLK or the frequency-divided clock signal generated by PLL circuit 20. Gear selection register 26 provides a control data for use in selecting either of the frequency-divided clock signals (for example, frequency-division ratio is single-fold, twofold, or fourfold). Also, standby mode selection register 28 provides a control data for the standby mode. When a control data indicating the standby mode is set in this standby mode selection register 28, clock control circuit 22 supplies a standby signal STB to PLL circuit 20, by which the operation of PLL circuit 20 is suspended. This results in suspending the internal clock ICLK.

The CPU in the internal circuit 14 detects an operation speed of the internal circuit 14 from the program instructions executed therein, and sets corresponding control data into respective registers 24, 26 and 28. Otherwise, on occurrence of such a case as any operation instruction having not been received for a predetermined period, the CPU sets a control data into standby mode selection register 28.

In such a way, clock control circuit 22 variably controls the frequency of the internal clock ICLK depending on the operation speed of the internal circuit 14. For this purpose, clock control circuit 22 obtains the operation speed of the internal circuit 14 at any time. Accordingly, in the embodiment of the present invention, this clock control circuit 22 controls a voltage level of the internal supply voltage IVcc generated by the internal supply voltage generation circuit 12. Typically, clock control circuit 22 sets into an internal supply voltage setting register 16 a voltage control signal VCONa corresponding to the frequency of the internal clock ICLK. The internal supply voltage generation circuit 12 then controls the level of the internal supply voltage IVcc generated in accordance with the setting data in this internal supply voltage setting register 16.

According to a typical control method, as shown in FIG. 1, when the frequency of the internal clock ICLK is high, the controlled internal supply voltage IVcc is high, while when the frequency of the internal clock ICLK is low, the controlled internal supply voltage IVcc is low. Thus clock control circuit 22 controls the internal supply voltage, as well as the internal clock signal frequency. For this reason, FIG. 3 depicts clock control circuit 22 as a clock & voltage control circuit 22.

The internal supply voltage setting register 16 can also be set from the CPU in the internal circuit 14 via an internal bus BUS, not only from clock & voltage control circuit 22. During program execution, the CPU can directly control the internal supply voltage level, as well as the internal clock signal frequency, through the internal supply voltage setting register 16.

When the internal circuit 14 is shifted to the standby mode, the internal clock ICLK becomes suspended, and also generation of the internal supply voltage, IVcc is suspended. This results in the suspension of the internal circuit 14 substantially completely. As a result, it becomes unable to perform a restoration operation from the standby mode to the normal operation mode. Considering this, an external reset circuit 18 is provided in the embodiment of the present invention. In response to a reset signal RST supplied externally, the external reset circuit 18 supplies an initialization signal INI to initialize the setting value in the internal supply voltage setting register 16. With this initialization operation, the internal supply voltage generation circuit 12 restarts generation of the internal supply voltage IVcc, thus resuming an operational condition of the internal circuit 14. This initialization signal INI is also supplied to clock & voltage control circuit 22. In response to this initialization signal INI, clock & voltage control circuit 22 resumes to generate the internal clock ICLK.

Thus, because of suspending generation of the internal supply voltage IVcc during the standby mode, such a configuration is also provided that the internal supply voltage IVcc is restored in response to a reset signal RST supplied from an external control circuit. An external supply voltage is supplied to the external reset circuit 18, which enables the external reset circuit 18 to be operational in response to the external reset signal RST during the standby mode.

Clock & voltage control circuit 22 controls both the frequency of the internal clock ICLK and the voltage level of the internal supply voltage IVcc. In this control, when the operation speed is shifted from high to low, the frequency of the internal clock ICLK is controlled to be lower, and at the same time, the level of the internal supply voltage IVcc is controlled to be lower. The control for decreasing the internal clock ICLK can be completed relatively in a short time, while decreasing the internal supply voltage IVcc is gradually in progress because of the smooth capacitor Cp or the like. Even in this condition, there occurs no disturbance against the normal operation of the internal circuit 14, as long as an internal supply voltage higher than the minimum operational voltage Vmin is supplied to the internal circuit 14.

In contrast, when the operation speed is shifted from low to high, it is required that control of increasing the internal supply voltage IVcc precedes frequency control. After ascertaining that the internal supply voltage IVcc has actually increased, the frequency of the internal clock ICLK is to be controlled to make higher. The reason is that ascending the internal supply voltage IVcc cannot progress promptly, as in the case mentioned earlier. Therefore, after the ascent of the internal supply voltage IVcc is ascertained, the frequency of the internal clock ICLK is controlled to increase up to the frequency which can maintain the internal circuit 14 operational with the voltage level at that time.

To attain the aforementioned control in the embodiment of the present invention, a supply voltage monitoring circuit 30 is provided in integrated circuit 10. This supply voltage monitoring circuit 30 monitors the level of the internal supply voltage IVcc generated by voltage regulator 12, and stores the detected voltage level into a supply voltage detection register 34. For this purpose, supply voltage monitoring circuit 30 is provided with comparators 31, 32 and 33, which compare the internal supply voltage IVcc with three reference voltages V1, V2 and V3, respectively. The output signals from these comparators are stored into supply voltage detection register 34. Details of this operation will be described later. The data set in supply voltage detection register 34 is supplied to clock & voltage control circuit 22 and referred to for the purpose of the frequency control of the internal clock ICLK. Namely, when the frequency of the internal clock ICLK is increased, the internal supply voltage Ivcc is controlled to increase. After ascertaining the ascent of the internal supply voltage Ivcc detected by the supply voltage monitoring circuit 30, the frequency of the internal clock ICLK is controlled to increase.

Figure 4:
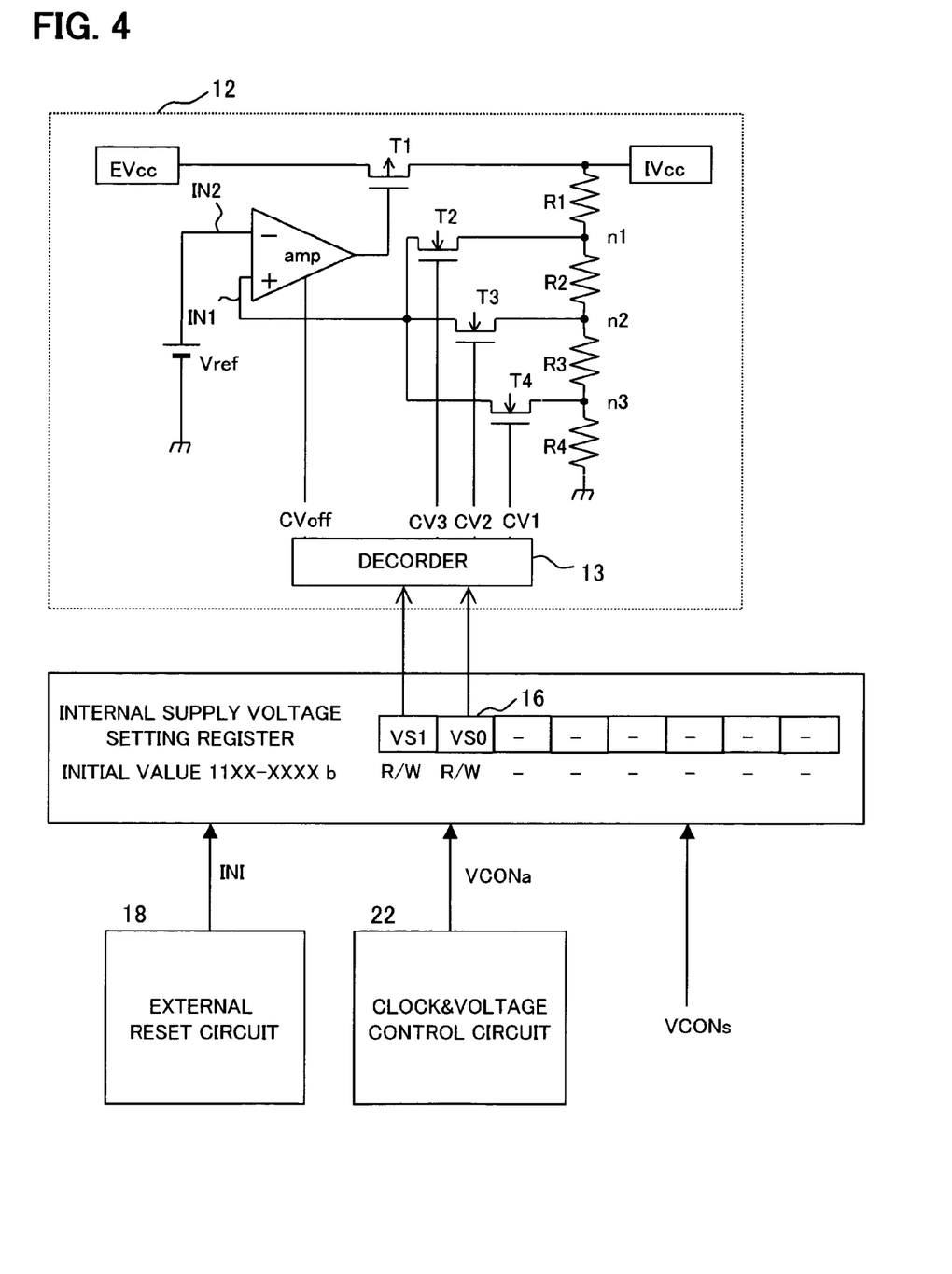
FIG. 4 shows a detailed circuit diagram of an internal supply voltage generation circuit.

FIG. 4 is a detailed circuit diagram of the internal supply voltage generation circuit 12. This internal supply voltage generation circuit 12 is comprised of, for example, a DC—DC regulator. A p-channel transistor T1 for voltage control is disposed between the supplied external supply voltage EVcc and the generated internal supply voltage IVcc. An output of a differential amplifier amp is supplied to the gate of this voltage control transistor T1. Here, the differential amplifier amp has a negative input terminal IN2 to which a reference voltage Vref is supplied, and a positive input terminal IN1 to which a resistance-divided voltage from the internal supply voltage IVcc is supplied. The internal supply voltage IVcc is divided by resistors R1, R2, R3 and R4. Each resistance-divided node n1, n2 and n3 are feedbacked to positive input terminal IN1 through respective feedback transistors T2, T3 and T4.

Any one of these feedback transistors T2, T3 and T4 is controlled to be in a conduction state, depending on outputs CV3, CV2 and CV1 of a decoder 13 which decodes a two-bit control data VS0, VS1 in the internal supply voltage setting register 16. Through one of the feedback transistors which is controlled to be in the conduction state, any one of the nodes n1, n2 and n3 is supplied to positive input IN1 of differential amplifier amp. Also, an output CVoff of decoder 13 is supplied to differential amplifier amp. In response to this, the output of differential amplifier amp is controlled to be in the H level, and voltage control transistor T1 is set into a non-conduction state. As a result, generation of the internal supply voltage IVcc is suspended, and the internal supply voltage IVcc is set to the grounding level due to the series of-resistors R1 to R4.

Differential amplifier amp becomes balanced when positive input IN1 becomes equal to negative input IN2. For example, when output CV3 of decoder 13 is in the H level, and feedback transistor T2 is in the conduction state, differential amplifier amp controls voltage control transistor T1 so that a voltage of node n1 becomes equal to the reference voltage Vref. When the voltage of node n1 becomes lower than the reference voltage Vref, the output of differential amplifier amp is controlled to be lower. In response to this, voltage control transistor T1 becomes more conductive, and the internal supply voltage IVcc becomes higher. As a result, the voltage of node n1 becomes increased, which leads to a stable condition when the voltage of node n1 reaches the level of the reference voltage Vref.

On the contrary, when the voltage of node n1 becomes higher than the reference voltage Vref, the output of differential amplifier amp is controlled to be higher. In response to this, voltage control transistor T1 becomes less conductive, and the internal supply voltage IVcc becomes lower. As a result, the voltage of node n1 becomes decreased, which leads to a stable condition when the voltage of node n1 reaches the level of the reference voltage Vref.

When control signal CV3 of decoder 13 indicates the H level, the internal supply voltage IVcc is led to a voltage level determined in accordance with the resistance division ratio of resistor R1 to resistors R2+R3+R4, because the voltage of node n1 is controlled to become equal to the reference voltage Vref. Also, when control signal CV2 indicates the H level, the internal supply voltage IVcc is led to a voltage level determined in accordance with the resistance division ratio of resistors R1+R2 to resistors R3+R4, because the voltage of node n2 is controlled to become equal to the reference voltage Vref. Further, when control signal CV1 indicates the H level, the internal supply voltage IVcc is led to a voltage level determined in accordance with the resistance division ratio of resistors R1+R2+R3 to resistor R4. Accordingly, the internal supply voltage IVcc is controlled to be the highest voltage when control signal CV1 indicates the H level. When control signal CV2 indicates H level, and then control signal CV3 indicates the H level, the internal supply voltage IVcc is controlled to be lower than before in that order.

Therefore, as shown in FIG. 1, when it is intended to control the internal supply voltage IVcc to be voltage V1, V2 or V3, control signals CV1, CV2 or CV3 is to be controlled to have the H level, respectively. In addition, at the time of the standby mode, control signal CVoff is set to the H level, and thus generation of the internal supply voltage IVcc is suspended.

In this internal supply voltage setting register 16, the setting value to be set into two bits VS0, VS1 is determined by the use of three control signals INI, VCONa and VCONs. As shown in FIG. 3, in response to the initialization signal INI supplied from the external reset circuit 18, two-bit setting value VS0, VS1 is set to an initial value (1, 1). When the initial value (1, 1) is set, control signal CV1 is led into the H level, and the internal supply voltage IVcc is controlled to have the highest voltage V1. Also, in response to control signal VCONa supplied from clock & voltage control circuit 22, the two-bit setting value VS0, VS1 is led into any of (1, 0), (0, 1) or (0, 0), in addition to the initial value (1, 1). When the setting value is (1, 0), control signal CV2 is led into the H level, resulting in the internal supply voltage IVcc controlled to have voltage V2. When the setting value is (0, 1), control signal CV3 is led into the H level, resulting in the internal supply voltage IVcc controlled to have voltage V3. Also, when the setting value is (0, 0), control signal CVoff is led into the H level, resulting in suspending generation of the internal supply voltage IVcc.

Further, the CPU in the internal circuit 14 may set variably setting values as VS0, VS1 in the internal supply voltage setting register 16 through control signal VCONs, as the CPU executes the program. In such a way, it is possible for the CPU to control the internal supply voltage directly.

Figure 5:
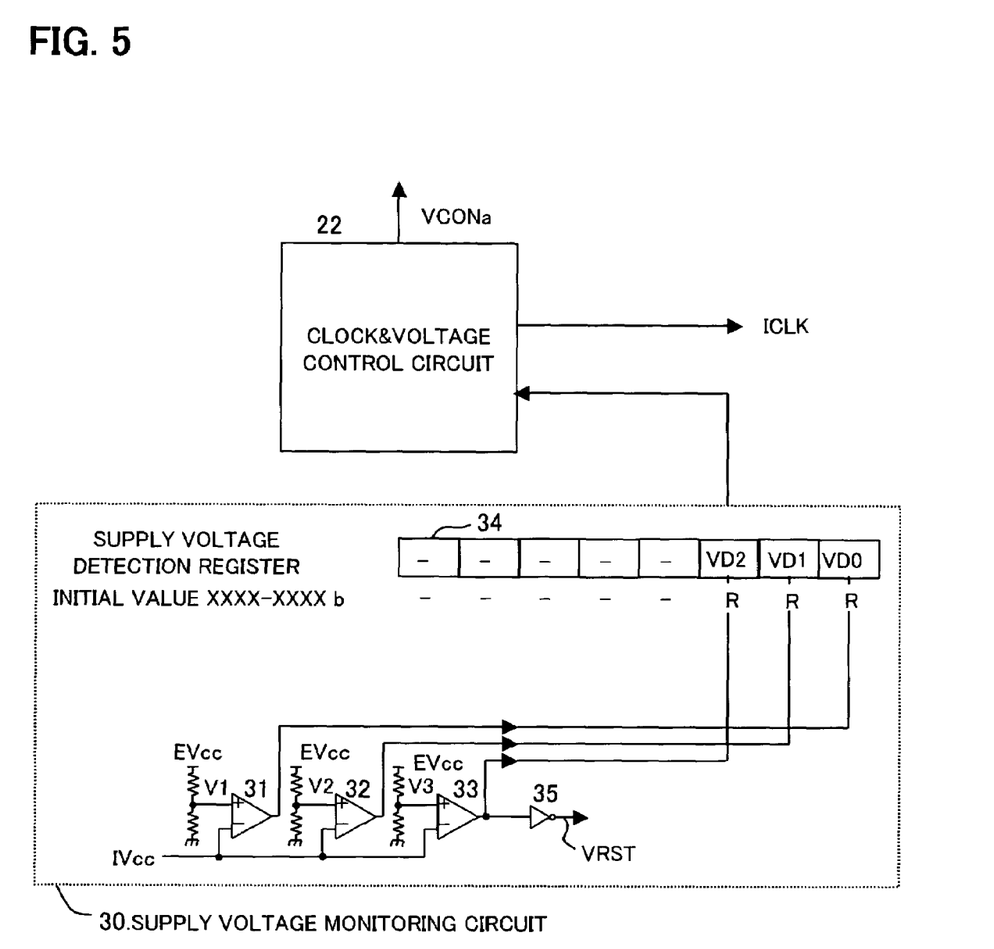
FIG. 5 shows a detailed circuit diagram of a supply voltage monitoring circuit.

Now, FIG. 5 shows a detailed circuit diagram of supply voltage monitoring circuit 30. This supply voltage monitoring circuit 30 is provided with differential comparators 31, 32 and 33 which respectively compare the reference voltages V1, V2 and V3 with the internal supply voltage IVcc; a supply voltage detection register 34 which stores an output from each differential comparator; and an inverter 35 which outputs a low-voltage reset signal VRST obtained by inverting an output of differential comparator 33.

With reference to the voltages V1, V2 and V3 shown in FIG. 1, when the internal supply voltage IVcc becomes no less than the voltage V1, the setting value VD0 in supply voltage detection register 34 is led into the L level, while when the internal supply voltage IVcc becomes less than the voltage V1, the setting value VD0 is led into the H level. When the internal supply voltage IVcc becomes no less than the voltage V2, the setting value VD1 in supply voltage detection register 34 is led into the L level, while when the internal supply voltage IVcc becomes less than the voltage V2, the setting value VD1 is led into the H level. Similarly, when the internal supply voltage IVcc becomes no less than the voltage V3, the setting value VD2 in supply voltage detection register 34 is led into the L level, while when the internal supply voltage IVcc becomes less than the voltage V3, the setting value VD2 in supply voltage detection register 34 is led into the H level. Accordingly, in supply voltage monitoring circuit 30, the detection data each VD0, VD1, VD2 in supply voltage detection register 34 is set the L level or the H level, depending on whether or not the internal supply voltage IVcc reaches the voltage V1, V2 or V3 from the highest voltage level.

As mentioned earlier, when controlling the internal clock ICLK to produce higher frequency, clock & voltage control circuit 22 outputs the voltage control signal VCONa so as to increase the internal supply voltage IVcc first. After supply voltage monitoring circuit 30 ascertains that the internal supply voltage IVcc reaches either voltage V1 or V2, clock & voltage control circuit 22 controls the internal clock ICLK so as to produce each frequency corresponding to each voltage V1 or V2. Thus, it becomes possible for the internal circuit 14 to receive the supplied internal supply voltage IVcc surely, which is higher than the minimum operational voltage Vmin at the frequency of the internal clock ICLK. In such a way, it becomes possible to prevent the internal circuit 14 from falling into an inoperable condition when the internal clock ICLK is controlled to have a higher frequency.

Supply voltage monitoring circuit 30 outputs the low-voltage reset signal VRST when the internal supply voltage IVcc becomes lower than the minimum voltage V3. This low-voltage reset signal is generated and externally output before the internal supply voltage IVcc becomes too low to retain data in registers and DRAM in the internal circuit 14. In short, the low-voltage reset signal VRST is a signal of alerting the decrease of the internal supply voltage to the outside. In response to this low-voltage reset signal VRST, for example, a control of saving the data from the registers and memories is performed by use of a predetermined method.

Additionally, generation of the internal supply voltage IVcc is suspended during the standby mode. However, because a shift to the standby mode is controlled and performed by the CPU in the internal circuit 14, the CPU saves data in the registers and memories by use of a predetermined method before the shift to the standby mode is instructed in standby mode selection register 28. Therefore, in this case, the low-voltage reset signal VRST is not output externally.

The aforementioned control of the internal supply voltage in the embodiment of the present invention will be summarized in the following.

(1) When turning on power:

When turning on power, a power-on reset signal is generated, and in response to an initialization signal INI, an initial value is set into an internal supply voltage setting register 16. Based on this, a controlled internal supply voltage IVcc is set into voltage V1 higher than the minimum operational voltage, with which the internal circuit is operational even at the maximum clock signal frequency within the specification.

(2) When shifting operation speed from high to low:

When a CPU controls the internal circuit to operate at lower speed, a control data is set in a gear selection register 26, so that a PLL circuit 20 selects a higher frequency division ratio. In response to this, a clock & voltage control circuit 22 selects a clock having a lower frequency, and outputs the selected clock signal as an internal clock ICLK. Further, while decreasing the frequency of the internal clock ICLK, clock & voltage control circuit 22 sets a predetermined voltage control signal VCONa into the internal supply voltage setting register 16. This causes voltage regulator 12 to generate a decreased level of the internal supply voltage IVcc.

(3) When shifting operation speed from low to high:

When the CPU controls the internal circuit to operate at higher speed, a control data is set in gear selection register 26, so that PLL circuit 20 selects a lower frequency division ratio. In response to this, clock & voltage control circuit 22 sets a predetermined voltage control signal VCONa into the internal supply voltage setting register 16, so as to control voltage regulator 12 to generate an increased level of the internal supply voltage IVcc. After a supply voltage detection register 34, which is provided in a supply voltage monitoring circuit 30, ascertains that the increased internal supply voltage has reached a desired level, clock & voltage control circuit 22 selects a clock signal having a higher frequency, and outputs the selected clock signal as the internal clock ICLK.

(4) Entering into a standby mode, and restoration therefrom:

When the CPU controls to enter into the standby mode, the CPU sets a standby mode selection register 28 after performing necessary process such as data saving. In response to this, clock & voltage control circuit 22 sets a standby mode data into the internal supply voltage setting register 16, so that voltage regulator 12 suspends generation of the internal supply voltage IVcc. Further, clock & voltage control circuit 22 outputs a standby mode signal STB to PLL circuit 20 to suspend clock signal generation. As a result, the internal clock ICLK is suspended. Thus, the internal circuit completely falls into a sleep state.

When restoring from the standby mode, the restoration is performed in response to a reset signal RST supplied from the outside, because the internal circuit has been in the complete sleep state. An external reset circuit 18 outputs the initialization signal INI, sets an initial value into the internal supply voltage setting register 16, and controls voltage regulator 12 to generate a maximum voltage V1. Also, clock & voltage control circuit 22 generates the internal clock ICLK having a maximum frequency.

(5) Another case of the control to modify the internal supply voltage.

It is possible to modify the setting value of the internal supply voltage setting register 16 from the CPU in the internal circuit through the internal bus BUS, not only from clock & voltage control circuit 22. Namely, the CPU controls the frequency of the internal clock ICLK by setting predetermined data into registers 24, 26 and 28. The CPU also controls the level of the internal supply voltage IVcc directly by setting a predetermined data into the internal supply voltage setting register 16.

As an example of performing the above-mentioned high-speed operation and low-speed operation, in the following, a case of integrated circuit 10 comprised of a microcomputer having communication control capability is described. When the microcomputer performs high-speed communication, the internal circuit (including CPU, memory, timer, etc.) in integrated circuit 10 is controlled in such a manner that the frequency of the internal clock ICLK is high, and also the internal supply voltage IVcc is high. In contrast, when the microcomputer performs low-speed communication, the internal circuit is controlled such that the frequency of the internal clock ICLK is low, and also the internal supply voltage IVcc is low. Further, when no communication is taking place, the internal circuit is set into the standby mode, in which the internal clock ICLK, as well as generation of the internal supply voltage IVcc, is suspended.

As having been described, control data corresponding to each operation mode are set into the relevant registers under the control of the CPU in the internal circuit. By the use of these data, the clock & voltage control circuit controls not only the frequency of the internal clock signal, but also the level of the internal supply voltage. Thus, it becomes possible to reduce power consumption to a larger extent than ever during low-speed operation of the circuit.

As the embodiment of the present invention has been described above, according to the present invention, the voltage level of the internal supply voltage can be controlled variably, which enables consumption power reduction during low-speed operation to a larger extent as compared to the conventional circuit.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A semiconductor integrated circuit comprising:
   an internal supply voltage generation circuit which generates an internal supply voltage by decreasing an external supply voltage;
   a supply voltage monitoring circuit which monitors a level of the internal supply voltage;
   a clock control circuit which generates an internal clock having a frequency controlled in accordance with an operation speed of an internal circuit and provides the generated internal clock to the internal circuit; and
   a voltage control circuit which controls the level of the internal supply voltage generated by the internal supply voltage generation circuit to become a level corresponding to the frequency of the internal clock,
   wherein, the clock control circuit increases the frequency of the internal clock to a first frequency from a second frequency lower than the first frequency, after the supply voltage monitoring circuit detects the level of the internal supply voltage is increased to a level corresponding to the first frequency, and
   wherein the supply voltage monitoring circuit outputs an internal reset signal when the level monitored by the supply voltage monitoring circuit becomes lower than a predetermined minimum level, so that data in a register or a memory in the internal circuit is saved in response to the internal reset signal.

2. The semiconductor integrated circuit according to claim 1,
   wherein, when the internal clock is controlled to have the first frequency, the internal supply voltage is controlled to have a first voltage, and when the internal clock is controlled to have the second frequency, the internal supply voltage is controlled to have a second voltage which is lower than the first voltage.

3. The semiconductor integrated circuit according to claim 1,
   wherein the controlled voltage level of the internal supply voltage is set higher than the minimum voltage level, over which the internal circuit is operational at each frequency of the internal clock.

4. The semiconductor integrated circuit according to claim 2,
   wherein the controlled voltage level of the internal supply voltage is set higher than the minimum voltage level, over which the internal circuit is operational at each frequency of the internal clock.

5. The semiconductor integrated circuit according to claim 2,
   wherein, when the internal supply voltage is controlled to increase from the second voltage to the first voltage, the frequency of the internal clock is controlled to change from the second frequency to the first frequency after increasing the internal supply voltage generated by the internal supply voltage generation circuit to the first voltage is ascertained to be complete.

6. The semiconductor integrated circuit according to claim 1,
   wherein, when the internal circuit is controlled to set into standby mode, the internal supply voltage generation circuit suspends generation of the internal supply voltage.

7. The semiconductor integrated circuit according to claim 6, further comprising:
   an external reset circuit which generates an initialization signal to restore the internal circuit from the standby mode,
   wherein, in response to said initialization signal, the internal supply voltage generation circuit resumes generation of the internal supply voltage.

8. The semiconductor integrated circuit according to claim 1,
   wherein, when turning on power, the internal supply voltage is controlled to have a maximum level of the internal supply voltage.

9. The semiconductor integrated circuit according to claim 1,
   wherein, in accordance with a program executed by a CPU in the internal circuit, the frequency of the internal clock generated by the clock control circuit is controlled, and further, the level of the internal supply voltage generated by the internal supply voltage generation circuit is controlled.

10. The semiconductor integrated circuit according to claim 9,
    wherein the executed program determines an operation is performed in either a high-speed operation mode or a low-speed operation mode, and when determined as being in the high-speed operation mode, the frequency of the internal clock is controlled to be higher, and also, the internal supply voltage is controlled to be higher, while when in the low-speed operation mode, the frequency of the internal clock is controlled to be lower, and also the internal supply voltage is controlled to be lower.

11. The semiconductor integrated circuit according to claim 9 further comprising:
a first register which supplies a voltage control signal to the internal supply voltage generation circuit; and
a second register which supplies an operation mode signal to the clock control circuit,
wherein the CPU modifies data stored in at least either one of the first register and the second register, depending on the executed program.

12. The semiconductor integrated circuit according to claim 1,
wherein the supply voltage monitoring circuit has a supply voltage detection register which stores data indicating the level monitored by the supply voltage monitoring circuit, and
wherein the clock control circuit changes the internal clock in accordance with the data stored in the supply voltage detection register.

13. A semiconductor integrated circuit comprising:
an internal supply voltage generation circuit which generates an internal supply voltage by decreasing an external supply voltage;
a supply voltage monitoring circuit which monitors a level of the internal supply voltage;
a clock control circuit which generates an internal clock having a frequency controlled in accordance with an operation speed of the internal circuit and provides the generated internal clock to the internal circuit;
a voltage control circuit which controls the level of the internal supply voltage generated by the internal supply voltage generation circuit to become a level corresponding to the frequency of the internal clock; and
an external reset circuit which generates an initialization signal to restore the internal circuit from the standby mode,
wherein, the clock control circuit increases the frequency of the internal clock to a first frequency from a second frequency lower than the first frequency, after the supply voltage monitoring circuit detects the level of the internal supply voltage is increased to a level corresponding to the first frequency,
wherein, when the internal circuit is controlled to set into standby mode, the internal supply voltage generation circuit suspends generation of the internal supply voltage, and
wherein, in response to said initialization signal, the internal supply voltage generation circuit resumes generation of the internal supply voltage.

14. The semiconductor integrated circuit according to claim 13,
wherein, when the internal clock is controlled to have the first frequency, the internal supply voltage is controlled to have a first voltage, and when the internal clock is controlled to have the second frequency, the internal supply voltage is controlled to have a second voltage which is lower than the first voltage.

15. The semiconductor integrated circuit according to claim 13,
wherein the controlled voltage level of the internal supply voltage is set higher than the minimum voltage level, over which the internal circuit is operational at each frequency of the internal clock.

16. The semiconductor integrated circuit according to claim 14,
wherein the controlled voltage level of the internal supply voltage is set higher than the minimum voltage level, over which the internal circuit is operational at each frequency of the internal clock.

17. The semiconductor integrated circuit according to claim 14,
wherein, when the internal supply voltage is controlled to increase from the second voltage to the first voltage, the frequency of the internal clock is controlled to change from the second frequency to the first frequency after increasing the internal supply voltage generated by the internal supply voltage generation circuit to the first voltage is ascertained to complete.

18. The semiconductor integrated circuit according to claim 13,
wherein, when turning on power, the internal supply voltage is controlled to have a maximum level of the internal supply voltage.

19. The semiconductor integrated circuit according to claim 13,
wherein, in accordance with a program executed by a CPU in the internal circuit, the frequency of the internal clock generated by the clock control circuit is controlled, and further, the level of the internal supply voltage generated by the internal supply voltage generation circuit is controlled.

20. The semiconductor integrated circuit according to claim 19,
wherein the executed program determines an operation is performed in either a high-speed operation mode or a low-speed operation mode, and when determined as being in the high-speed operation mode, the frequency of the internal clock is controlled to be higher, and also, the internal supply voltage is controlled to be higher, while when in the low-speed operation mode, the frequency of the internal clock is controlled to be lower, and also the internal supply voltage is controlled to be lower.

21. The semiconductor integrated circuit according to claim 19 further comprising:
a first register which supplies a voltage control signal to the internal supply voltage generation circuit; and
a second register which supplies an operation mode signal to the clock control circuit,
wherein the CPU modifies data stored in at least either one of the first register and the second register, depending on the executed program.

22. The semiconductor integrated circuit according to claim 13,
wherein the supply voltage monitoring circuit has a supply voltage detection register which stores data indicating the level monitored by the supply voltage monitoring circuit, and
wherein the clock control circuit changes the internal clock in accordance with the data stored in the supply voltage detection register.

23. The semiconductor integrated circuit according to claim 13,
wherein the supply voltage monitoring circuit outputs an internal reset signal when the level monitored by the supply voltage monitoring circuit becomes lower than a predetermined minimum level.

* * * * *